United States Patent [19]
Kamezaki et al.

[11] Patent Number: 5,458,709
[45] Date of Patent: Oct. 17, 1995

[54] PROCESS FOR MANUFACTURING MULTI-LAYER GLASS CERAMIC SUBSTRATE

[75] Inventors: Hiroshi Kamezaki; Masato Wakamura; Kishio Yokouchi; Nobuo Kamehara, all of Kawasaki, Japan

[73] Assignee: Fujitsu Limited, Kawasaki, Japan

[21] Appl. No.: 867,513

[22] Filed: Apr. 13, 1992

[30] Foreign Application Priority Data

Apr. 12, 1991 [JP] Japan .................. 3-079457

[51] Int. Cl.⁶ .................................. B32B 18/00
[52] U.S. Cl. .............................. 156/89; 264/61
[58] Field of Search .............. 156/89, 313; 264/61

[56] References Cited

U.S. PATENT DOCUMENTS

| | | | |
|---|---|---|---|
| 4,642,148 | 2/1987 | Kurihara et al. | 156/89 |
| 4,840,653 | 6/1989 | Rabinovich | 264/1.5 |
| 4,865,875 | 9/1989 | Kellerman | 156/89 |
| 4,867,935 | 9/1989 | Morrison, Jr. | 156/89 |
| 5,173,457 | 12/1992 | Shorthouse | 501/65 |

FOREIGN PATENT DOCUMENTS

| | | | |
|---|---|---|---|
| 59-9992 | 1/1984 | Japan | H05K 1/00 |
| 60-254697 | 12/1985 | Japan | H05K 3/46 |
| 61-12091 | 1/1986 | Japan | H05K 1/03 |
| 61-83674 | 4/1986 | Japan | C04B 35/14 |

OTHER PUBLICATIONS

Abe, *Patent Abstracts of Japan* C912, vol. 16, No. 66 published Feb. 19, 1992.
*12th Edition Materials Handbook*, Brady & Clausen, copyright 1986 p. 170.

*Primary Examiner*—Christopher A. Fiorilla
*Attorney, Agent, or Firm*—Staas & Halsey

[57] ABSTRACT

A process for manufacturing a multi-layer glass ceramic substrate which includes the steps of forming green sheets containing ceramic powders and glass powders as main ingredients, laminating the green sheets, and firing the laminated green sheets to form a multi-layer glass ceramic substrate, wherein at least one green sheet containing porous glass powders as a part of the glass powders, is provided to control the shrinkage of the green sheets and prevent cracks or delamination. The preferred process includes the steps of forming a single layer by i) forming first green sheets containing ceramic powders, glass powders, hollow glass spheres and porous glass powders as main ingredients, ii) forming an interconnection layer on each of the first green sheets, and iii) laminating the first green sheets with the interconnection layer; sandwiching the signal layer between upper and lower green sheets containing ceramic powders and glass powders as main ingredients; and firing the sandwiched signal layer to form the multi-layer glass ceramic substrate.

8 Claims, 7 Drawing Sheets

RELATIONSHIP BETWEEN FIRING TEMPERATURE AND X-Y SHRINKAGE

RELATIONSHIP BETWEEN FIRING TEMPERATURE AND
  X-Y SHRINKAGE

RELATIONSHIP BETWEEN FIRING TEMPERATURE AND X-Y SHRINKAGE

FIRING

PROCESS FOR MANUFACTURING MULTI-LAYER GLASS CERAMIC SUBSTRATE

BACKGROUND OF THE INVENTION

1. Field of the Invention

The present invention relates to a process for manufacturing a multi-layer glass ceramic substrate, in which the firing shrinkage factors of the layers are controlled to eliminate the problem of a delamination between layers.

Information processors (CPU's) are designed to have a small size and a bulk storage capacity and to rapidly process a large quantity of information. Also, semiconductor devices are assembled with a high packaging density, and as a result, are equipped with a large number of semiconductor elements such as LSI's and VLSI's densely arranged thereon.

As circuit boards carrying these semiconductor elements in these devices, initially multi-layer printed circuit boards comprising, for example, a glass epoxy were used. Recently, however, the generated heat per semiconductor chip has become more than 10 W, as the integration density of a semiconductor device has increased and accordingly, the multi-layer printed circuit board has been replaced by a ceramic substrate having a superior heat resistance.

2. Description of the Related Art

Initially, alumina ($Al_2O_3$) ceramics were employed as materials for ceramic substrates, and tungsten (W) was used as a metal material for forming patterns of wiring. The signal frequency processed by or transmitted through such a device reaches frequencies on the order of MHz, in line with the increased speed of information processing and optical communication, is already in practical use and as a result, the use of ceramic substrates having a low loss and conductive materials having a low electrical resistance is required.

In this respect, although copper (Cu) is a preferred conductive material having a low electrical resistance, it has a low melting point on the order of 1084° C., and accordingly, copper cannot be used as a material for distributing wires of a multi-layer circuit board comprised of alumina ceramics, the green sheet of which requires a firing temperature of more than 1400° C.

Accordingly, glass ceramics requiring a low firing temperature are used.

More specifically, glass ceramics require a low firing temperature on the order of not more than 1000° C., and this allows the use of metallic materials such as gold (Au) and Cu having good electrical conductivities.

Typical examples of glass ceramics are composed of alumina powder and borosilicate glasses. The use of these glass ceramics is effective for the following reasons. The dielectric constant of the borosilicate glass is low, on the order of about 4, and correspondingly, the combined dielectric constant of the resulting composite material ranges from 5 to 7, which is lower than that (about 10) of alumina ceramics. This accordingly allows a shortening of the signal delay time.

Nevertheless, it has become necessary to further reduce the combined dielectric constant of substrates, in proportion to the increased speed of the signal transmission, and accordingly, a part of the borosilicate glass is replaced with hollow silica powder.

Namely, the use of the hollow silica powder permits a further reduction of the combined dielectric constant, since the dielectric constant of air is 1.

The mechanical strengths of glass ceramics, however, are not satisfactory; for example, the bending strength thereof is on the order of 150 to 200 MPa, which is lower than that of alumina ceramics. The mechanical strength of the resulting glass ceramics would be further reduced if a part of the borosilicate glass component were replaced by the hollow silica powder, and accordingly, the glass ceramics would be easily damaged.

To solve this problem, i.e., to improve the mechanical strength of the resulting multi-layer glass ceramic substrate, a method has been proposed which comprises forming signal layers, which are elements of the multi-layer glass ceramic substrate and on which patterns of signal lines are formed, from a glass ceramic containing hollow silica powder, and forming other layers of the substrate, such as the uppermost and lowermost layers which do not affect the quality of a signal, from a glass ceramic free of the hollow silica powder.

In this case, however, the multi-layer glass ceramic substrate comprises layers having different compositions and this leads to the occurrence of a delamination between the signal layers and the upper and lower layers of the substrate during the firing of the corresponding green sheets, due to the differences in the firing shrinkage factors of these layers having different compositions.

Accordingly, an object of the present invention is to solve this problem.

SUMMARY OF THE INVENTION

According to the present invention, there is provided a process for manufacturing a multi-layer glass ceramic substrate, comprising the steps of forming green sheets containing ceramic powders and glass powders as main ingredients, laminating the green sheets, and firing the laminated green sheets to form the multi-layer glass ceramic substrate, wherein at least one green sheet contains a porous glass powder as a part of said glass powders.

The present invention also provides a process for manufacturing a multi-layer glass ceramic substrate, comprising the steps of (A) forming a signal layer by i) forming first green sheets containing ceramic powders, glass powders, hollow glass spheres and porous glass powders as main ingredients, ii) forming an interconnection layer on each of the first green sheets, and iii) laminating the first green sheets with the interconnection layers, the laminated sheets and layers being defined as "the signal layer", (B) sandwiching said signal layer by upper and lower green sheets containing ceramic powders and glass powders as main ingredients, and (C) firing said sandwiched signal layer to form the multi-layer glass ceramic substrate.

The foregoing problem can be solved by providing a method of manufacturing a multi-layer glass ceramic substrate, which comprises the steps of forming green sheets mainly comprising ceramic powders, glass powders, hollow glass microspheres and porous glass powders; forming patterns of distributing wires on the green sheets and laminating the green sheets to form a laminated signal layer; sandwiching the signal layer between green sheets mainly comprising ceramic powders and glass powders, to unite the layers; and then firing the united layers.

In the method of the present invention, porous glass powders are used for an intermutual adjusting and coinciding of the firing shrinkage factors of green sheets comprising glass ceramics having different compositions.

More specifically, the porous glass powders have a high unevenness and thus have large surface areas and therefore, the layer containing the porous glass powders undergoes a high degree of shrinkage during the firing.

Therefore, the firing shrinkage factor of the green sheet can be adjusted by controlling the amount of the porous glass powders to be incorporated in such a manner that the shrinkage factor is increased.

Thus, the amount of said porous glass powders is selected such that a shrinkage of said first green sheets matches that of said upper and lower green sheets during the firing, to thereby prevent a cracking or delamination of said upper and lower green sheets during the firing.

In the present invention, silica ($SiO_2$) is preferably used as a material for the porous glass powders, because the silica has excellent electrical properties and does not suffer from a reduction of the insulation resistance and electrical dielectric breakdown resistance.

In the present invention, high purity porous glass powders obtained through the sol-gel process are added to green sheets having low firing shrinkage factors, to form signal layers and increase the firing shrinkage factors of the green sheets forming the signal layers.

DESCRIPTION OF THE PREFERRED EMBODIMENTS

Figure 1:
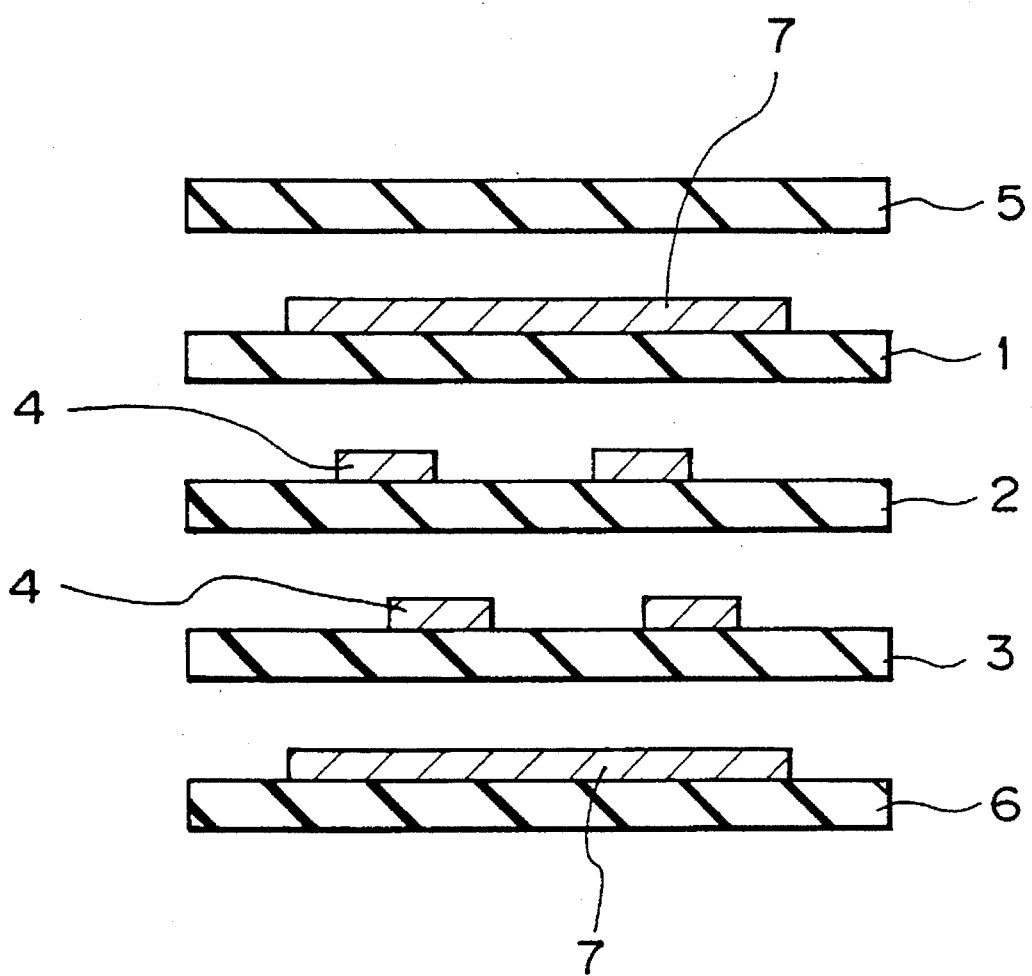
FIG. 1 is a diagram showing the structure of a multi-layer substrate.

FIG. 1 is a cross sectional view showing the structure of a multi-layer circuit board as explained above and composed of 5 layers of green sheets.

More specifically, three layers of green sheets, i.e., the first layer 1, the second layer 2 and the third layer 3, are formed from glass ceramic green sheets containing hollow silica spheres, and signal distributing wires 4 are patterned on the surfaces of the second and third layers of green sheets 2 and 3.

The upper layer of green sheet 5 and the lower layer of green sheet 6 are formed from glass ceramic green sheets free of hollow silica powders, a ground layer 7 is patterned between the first layer 1 and the upper layer 5 and between the third layer 3 and the lower layer 6, these layers of green sheets are then united to give a laminated green sheet, and the laminated green sheet is fired to give a multi-layer substrate having excellent transmission characteristics.

If a multi-layer glass ceramic substrate is formed from these different materials, however, delamination is liable to occur due to the difference in the firing shrinkage factors of the green sheets containing hollow silica powder (the first to third layers 1 to 3) and those free of hollow silica powder (the upper and lower layers 5 and 6) and this tendency becomes even more conspicuous as the surface area of the substrate is increased.

Figure 2:
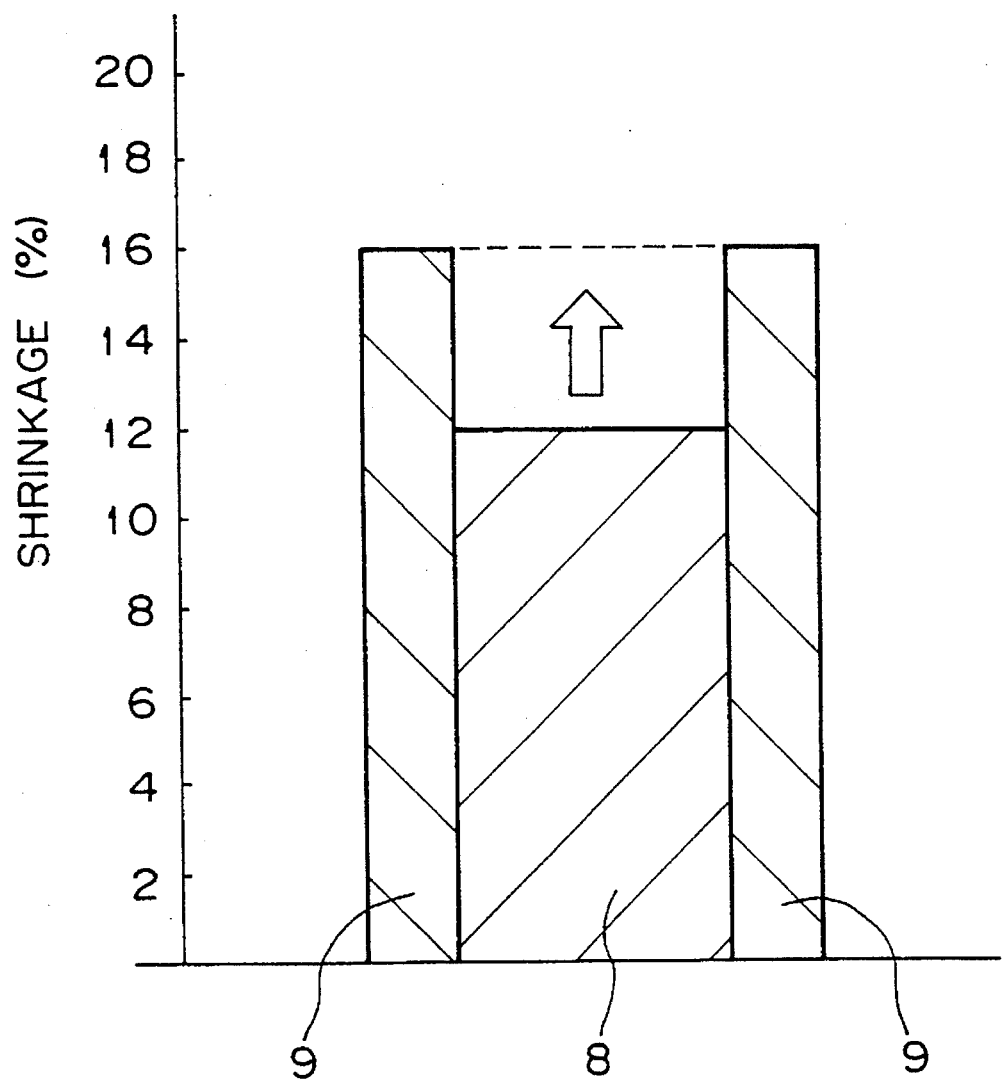
FIG. 2 is a diagram illustrating the principle of the present invention for increasing the firing shrinkage factor of a green sheet for a signal layer.

The principle of the present invention, which allows a solution of this problem, will be explained with reference to FIG. 2.

A green sheet for signal layer 8 is formed from a material principally comprising ceramic powders, glass powders and hollow glass microspheres, to reduce the dielectric constant of the glass ceramic layer formed by sintering the green sheet for the signal layer 8. The hollow glass microspheres have a particle size greater than those of the other powders, have a spherical shape, and remain as a hollow structure even at a firing temperature. Therefore, the green sheets comprising the hollow glass microspheres have a low firing shrinkage factor on the order of about 12%.

Glass ceramic layers 9 (hereinafter simply referred to as "reinforcing layer(s)") mainly comprising ceramic powders and glass powders, which are arranged on and below the green sheets of the signal layer 8, have high firing shrinkage factors on the order of about 16%.

In the present invention, the green sheet for the signal layer 8 is formed from the foregoing conventional material, which principally comprises ceramic powders, glass powders and hollow glass microspheres and to which porous glass powders are added as an additional ingredient, to increase the firing shrinkage factor to about 16% (from the conventional value of about 12%) and thus coincide the value thereof with those for the reinforcing layers 9, whereby the problem of delamination can be solved by the present invention.

Figure 3A:
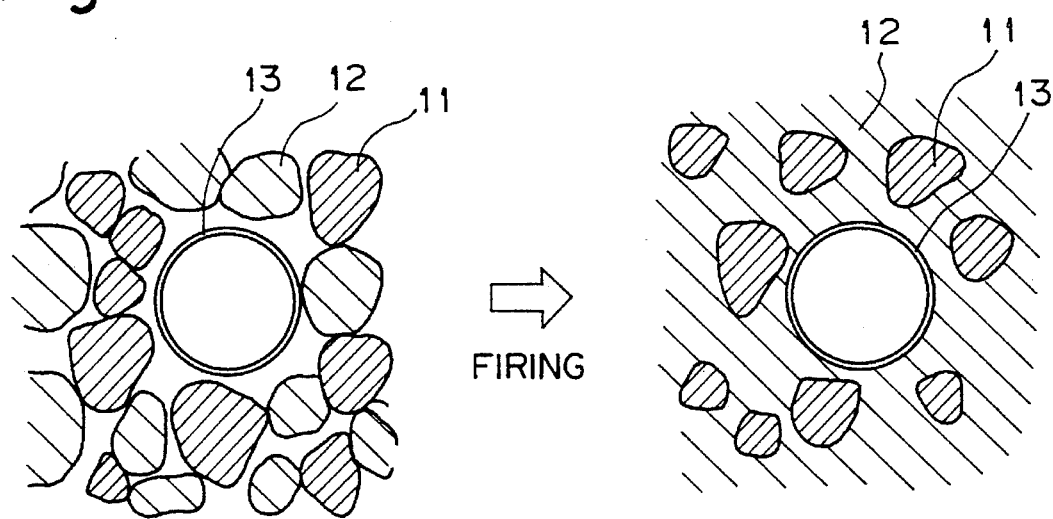
FIG. 3A is a diagram illustrating the firing of a green sheet comprising ceramic particles, glass particles having a low softening point and hollow glass microspheres.

FIG. 3A schematically shows this principle. When a green sheet comprising alumina particles 11, borosilicate glass particles 12 and hollow glass microspheres 13 is fired, the borosilicate glass particles 12 are fused or soften to form a matrix in which the alumina particles 11 and the hollow glass microspheres 13 are dispersed. In this respect, the presence of the hollow glass microspheres 13 in the green sheet minimizes the shrinkage of the sheet.

Figure 3B:
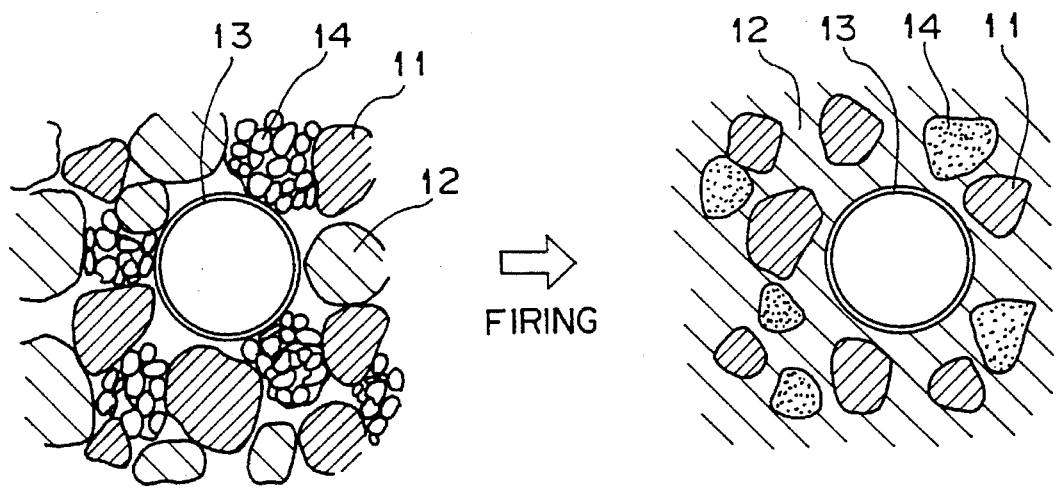
FIG. 3B is a diagram illustrating the firing of a green sheet comprising ceramic particles, glass particles having a low softening point, hollow glass microspheres and porous glass powder.
Figure 4:
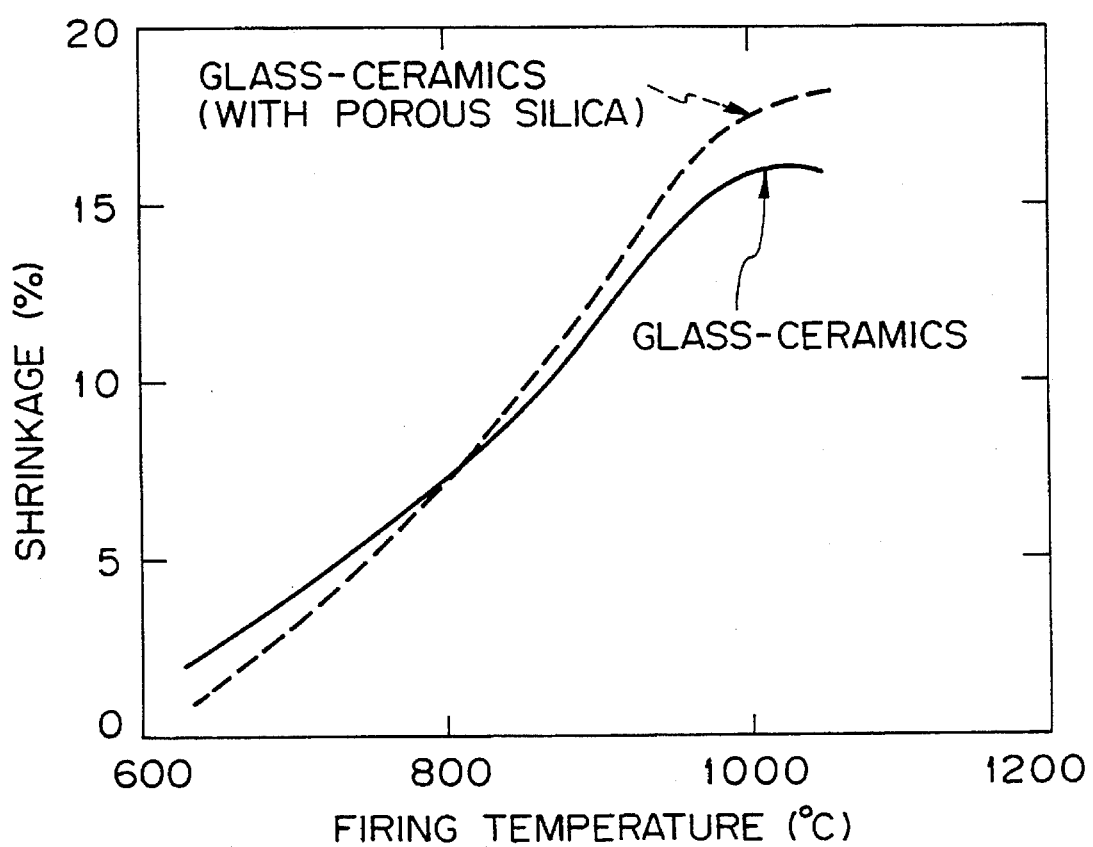
FIG. 4 is a diagram showing the shrinkage behavior of the green sheet prepared in Example 1.
Figure 5:
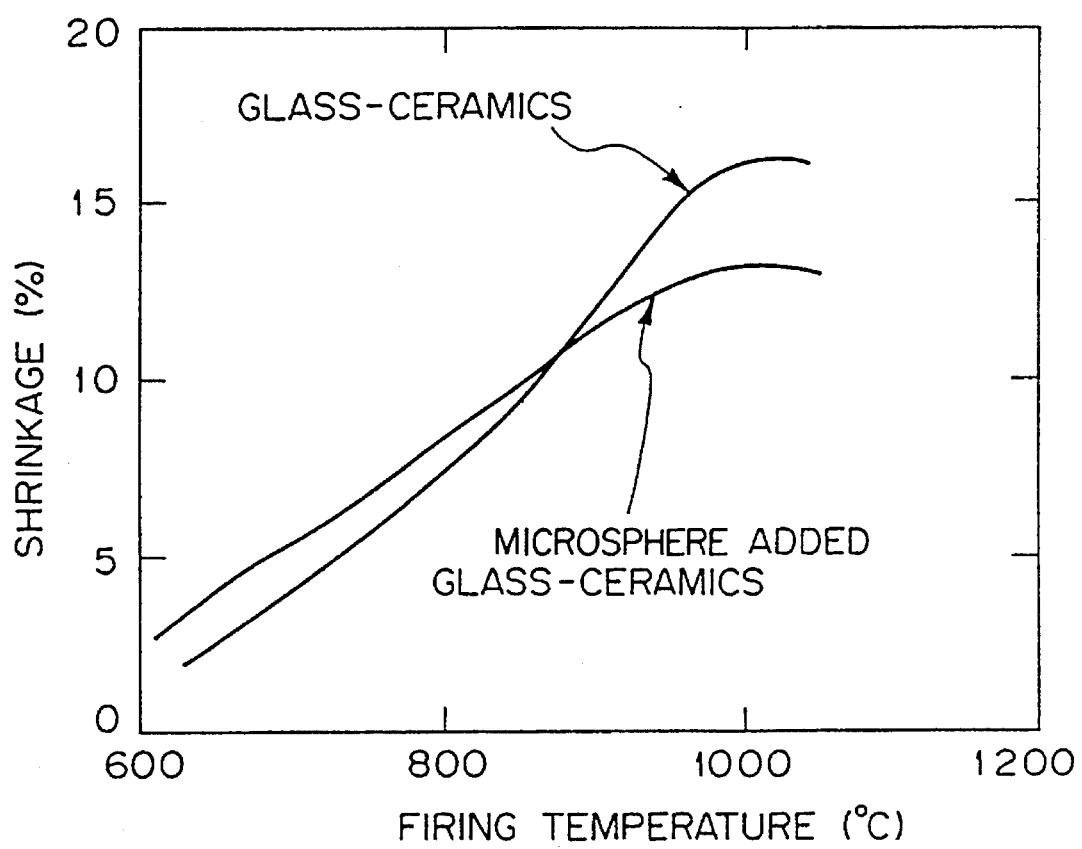
FIGS. 5 and 6 are diagrams showing the shrinkage behavior of the green sheet prepared in Example 2.
Figure 6:
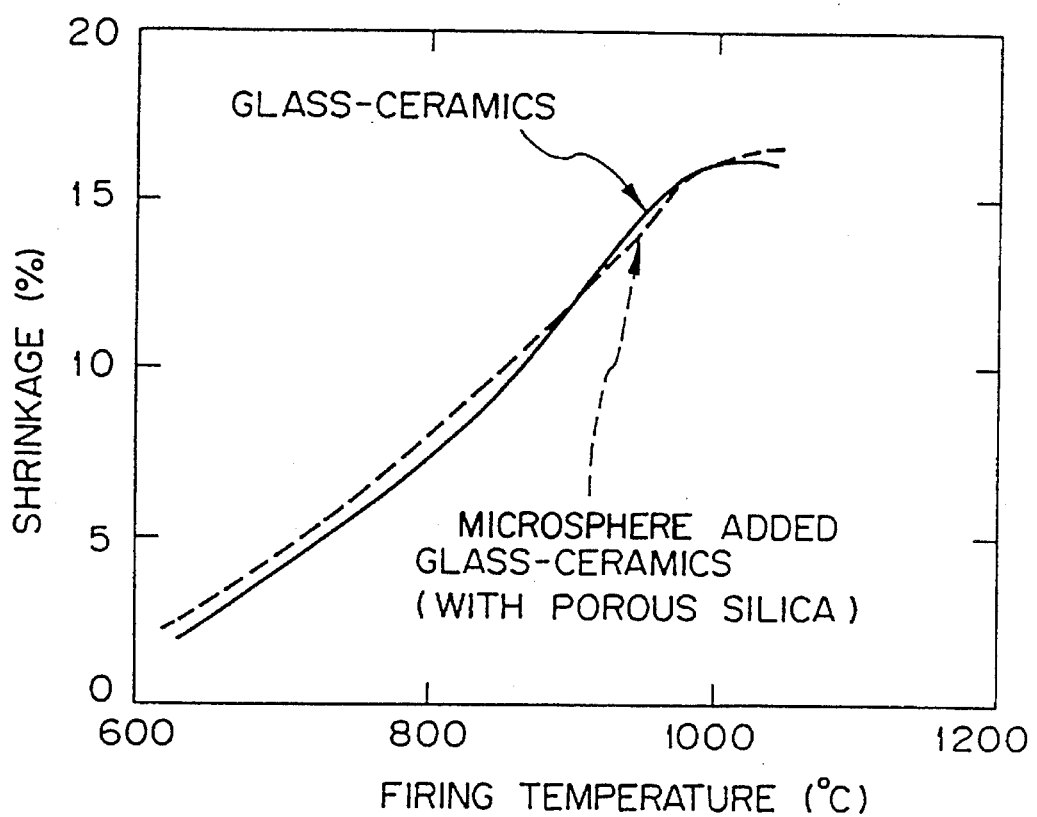

If the green sheet for the signal layer comprises porous silica particles 14 in addition to alumina particles 11, borosilicate glass particles 12 and hollow glass microspheres 13, the porous silica particles 14, which suffer a large shrinkage during firing as shown in FIG. 3B or FIG. 4, can compensate the low shrinkage factor of the hollow glass micro spheres 13 as shown in FIG. 5, and therefore, the overall firing shrinkage factor of the resulting green sheet can be coincided with that of a green sheet comprising alumina particles 11 and borosilicate particles 12 and free of hollow fine glass spheres 13 as shown in FIG. 6.

Typical examples of the porous glass particles include those obtained through the sol-gel method, i.e., those obtained by hydrolyzing silicon alkoxides such as methoxy silicate [$Si(OCH_3)_4$] and ethoxy silicate [$Si(OC_2H_5)_4$], which are prepared by reacting water glass with alcohols to give hydrate oxide sols, subjecting the sols to dehydration to form gels, and then heating the gels to form amorphous $SiO_2$. The porous silica is an aggregate of the fine particles of silica and has a high shrinkage factor during firing, in proportion to the pores present therein. The porous glass also can be prepared by forming a glass in which sodium is dispersed in a glass matrix, and then leaching the sodium phase.

The ceramic particles used in the present invention are added to the green sheets for improving the mechanical strength of the resulting substrate and stabilizing the glass (or preventing crystallization of the glass). Typical examples thereof are the alumina type such as alumina and mullite. Further, it is possible to use a glass such as silica, which is not softened at the firing temperature. The particle size of the ceramic particles is not critical in the present invention, but those having a particle size of from 2 to 3 μm are usually employed. The amount of the ceramic (alumina etc.) particles to be incorporated ranges from 10 to 70% by weight on the basis of the total weight of the inorganic materials for preparing glass ceramic component of the green sheets, which comprises the ceramic particles or high softening point glass particles, hollow glass microspheres, glass particles and porous glass particles and a part of the ceramic particles are replaced with hollow glass microspheres. The upper limit of the amount of the hollow glass microspheres to be incorporated is on the order of 40% by weight on the basis of the total weight of the inorganic materials.

The hollow glass microspheres are added to the material for reducing the dielectric constant of the resulting glass cermamic layer formed by sintering the green sheet. The size thereof is preferably as small as possible, and those having a particle size of not less than about 10 μm are readily available on the market.

The low softening point glass is a glass capable of being softened at a temperature of not more than the firing temperature, and typical examples thereof usable in the invention are a borosilicate glass having a softening point of about 800° C. The amount of the low softening point glass is approximately a half of the remaining portion of the inorganic materials (30 to 90% by weight) other than the ceramic particles and the hollow glass microspheres and in general ranges from about 15 to 50% by weight, with the balance being the porous glass powders.

Both the low softening point glass particles and porous glass particles usable in the invention usually have a particle size of about 2 to 3 μm.

According to the present invention, the amount of the porous glass powders to be incorporated into the inorganic material is determined in such a manner that the difference in the firing shrinkage factors of the green sheet comprising the ceramic particles and the low softening point glass particles and free of the hollow glass microspheres and the green sheet comprising the ceramic particles, low softening point glass particles, hollow glass microspheres and porous glass powders is preferably not more than ±0.5%, more preferably not more than ±0.2%, as determined for a sheet having a size, for example, of 300 mm².

Note, the dielectric constants are 10 for the alumina, 4.6 for the borosilicate glass, about 1.3 for the hollow glass microspheres and 3.8 for the porous silica respectively. The conventional glass ceramic substrate comprising alumina, borosilicate glass and silica glass has a dielectric constant of 5 to 6, and the substrate containing hollow glass microsphere, in addition to the foregoing ingredients, has a dielectric constant of about 4 to 2.5.

According to the method of the present invention, a multi-layer glass ceramic substrate can be manufactured by adding additives such as a binder, a solvent and/or a plasticizer to a mixture of ceramic particles, low softening point glass particles, hollow glass microspheres and porous glass powders, and kneading the resulting mixture to form a slurry; forming the slurry into green sheets; patterning signal distributing wires on the green sheets and laminating the green sheets to form a signal layer; separately forming green sheets mainly comprising ceramic particles and glass particles; sandwiching the laminated signal layer between the resulting upper and lower green sheets to unite these layers; and then firing the resulting laminate.

The firing can be performed in a nitrogen gas atmosphere when the conductive material used is copper or in the air when it is gold or an alloy of silver and palladium. More specifically, when the conductive material is copper, the firing temperature of the laminate is raised to about 850° C. at a temperature elevation rate of about 50° C./hr in a wet nitrogen atmosphere and the laminate is maintained at that temperature over 4 hours, then the temperature is raised to 1000° C. in a dry nitrogen atmosphere, the temperature of the laminate is maintained at about 1000° C. for 4 hours, and then the laminate is cooled.

The layers free of the hollow glass microspheres arranged on and below the signal layer serve to impart a mechanical strength and evenness to the resulting multi-layer substrate. Also the upper and lower surfaces of the substrate can be ground to improve the evenness thereof.

EXAMPLE 1

Confirmation of Improved Firing Shrinkage Factor

The following ingredients were mixed and kneaded to give a slurry, followed by a degassing and formation of a green sheet having a thickness of 300 μm, through the doctor blade process.

| | |
|---|---|
| Alumina powders | 100 g |
| Borosilicate glass powders | 200 g |
| Porous silica glass powders | 200 g |
| Acetone (solvent) | 80 g |
| Methyl ethyl ketone (solvent) | 350 g |
| Dibutyl phthalate (plasticizer) | 30 g |
| Poly(methyl methacrylate) (binder) | 100 g |

The green sheet was then formed into pieces 9×9 cm, by blanking, and subsequently, a copper (Cu) paste was applied onto the surface thereof to form lines of the conductive material, by a screen printing process.

Thereafter, 8 of these green sheets were stacked in layers, a pressure of 10 MPa was applied to the laminated green sheets at 80° C., to unite the same, and the united laminate then fired at 1,000° C. for 5 hours to give a multi-layer substrate.

As shown in FIG. 4, the resulting substrate had a firing shrinkage factor of 18%. Namely, the firing shrinkage factor was 2% higher than that (16%) of the conventional multi-layer substrate free of the porous silica glass powders.

EXAMPLE 2

Formation of Multi-layer Substrate Comprising a Signal Layer and Reinforcing Layers The following ingredients were mixed and kneaded to give a slurry, followed by a degassing and formation of a green sheet having a thickness of 300 µm, through the doctor blade process.

| | |
|---|---|
| Mullite powders | 100 g |
| Borosilicate glass powders | 100 g |
| Porous silica glass powders | 50 g |
| Hollow silica microspheres | 50 g |
| Acetone (solvent) | 80 g |
| Methyl ethyl ketone (solvent) | 350 g |
| Dibutyl phthalate (plasticizer) | 30 g |
| Poly(methyl methacrylate) (binder) | 100 g |

Then the green sheet was formed into pieces 9×9 cm by blanking, to give green sheets for a signal layer, and subsequently, a copper (Cu) paste was applied onto the surfaces of 8 sheets of these green sheets to form lines and vias of the conductive material, by a screen printing process.

Thereafter, the following ingredients were mixed and kneaded to give a slurry, followed by a degassing and formation of a green sheet having a thickness of 300 µm, through the doctor blade process.

| | |
|---|---|
| Alumina powders | 200 g |
| Borosilicate glass powders | 200 g |
| Silica glass powders | 200 g |
| Acetone (solvent) | 80 g |
| Methyl ethyl ketone (solvent) | 350 g |
| Dibutyl phthalate (plasticizer) | 30 g |
| Poly(methyl methacrylate) (binder) | 100 g |

Then the green sheet was formed into pieces 9×9 cm, by blanking, to give green sheets for reinforcing layers.

Thereafter, one each of the green sheets for the reinforcing layer was put on upper or lower surface of each the green sheet for the signal layer (8 sheets in all), the sheets then stacked as layers, a pressure of 10 MPa applied to the resulting laminate at 80° C., to unite same, and the united laminate then fired at 1000° C. for 5 hours to give a multi-layer substrate.

No cracking or delamination was observed between the reinforcing layers and the signal layers.

Figure 7:
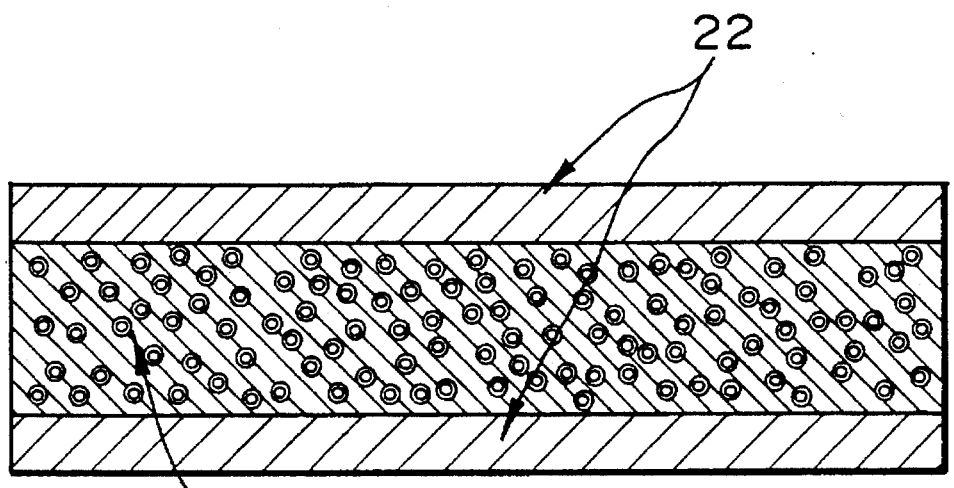
FIG. 7 is a diagram for explaining the occurrence of cracking and delamination of a conventional multi-layer ceramic substrate.
Figure 7:
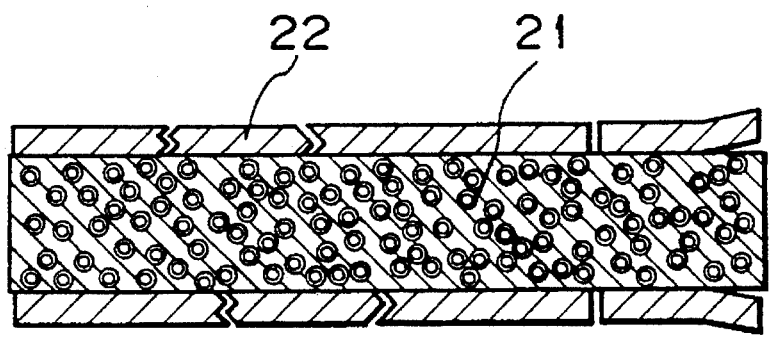

FIG. 5 shows firing shrinkage factor curves of the foregoing green sheet for the reinforcing layer and a usual hollow silica microsphere-containing green sheet, which has the same composition as that of the foregoing green sheet for signal layer except for replacing all of the porous silica glass powders with hollow silica microspheres. For example, the former has a firing shrinkage factor of 18% and the latter has a shrinkage factor of 13%, and correspondingly, the difference in the firing shrinkage factor there between is as much as 5%. Therefore, if these green sheets are combined and united, the multi-layer substrate obtained after firing suffers from the problems of cracking and delamination as shown in FIG. 7. In FIG. 7, reference numerals 21 and 22 represent a signal layer and a reinforcing layer respectively, which indicate both the state of the green sheet and the sintered glass ceramic layer.

FIG. 6 shows the firing shrinkage factor curves of the green sheet for the reinforcing layer and that for the signal layer (comprising hollow silica microspheres and porous silica glass powders) obtained in the foregoing Example. The curves shown in FIG. 6 indicate that the shrinkage behavior of the reinforcing layer closely coincides with that observed on the signal layer.

We claim:

1. A process for manufacturing a multi-layer glass ceramic substrate, comprising the steps of:

forming a signal layer by i) forming first green sheets containing ceramic powders, glass powders, hollow glass spheres and porous glass powders as main ingredients, ii) forming an interconnection layer on each of the first green sheets, and iii) laminating the first green sheets having the interconnection layer formed thereon, sandwiching said signal layer between upper and lower green sheets containing ceramic powders and glass powders as main ingredients, and firing said sandwiched signal layer to form the multi-layer glass ceramic substrate.

2. A process according to claim 1, wherein an amount of said porous glass powders is selected to match a shrinkage of said first green sheets with that of said upper and lower green sheets during the firing so that a cracking or delamination of said upper and lower green sheets during firing is prevented.

3. A process according to claim 2, wherein said porous glass powders are porous silica powders.

4. A process according to claim 1, wherein said porous glass powders are made by a sol-gel method.

5. A process according to claim 1, wherein said glass powders in said upper and lower green sheets include glass powders having a softening point lower than the firing temperature, which are softened during the firing, and glass powders having a softening point higher than the firing temperature, which are not softened during the firing.

6. A process according to claim 1, wherein said interconnection layer is made of copper.

7. A process according to claim 1, wherein, in said signal layer, said ceramic powders are of alumina, said glass powders are of borosilicate glass, said hollow glass spheres are of hollow silica microspheres, and said glass porous glass powders are of porous silica powders.

8. A process according to claim 1, wherein said firing is carried out at about 1000° C.

* * * * *

UNITED STATES PATENT AND TRADEMARK OFFICE
CERTIFICATE OF CORRECTION

PATENT NO. : 5,458,709
DATED : Oct. 17, 1995
INVENTOR(S) : KAMEZAKI et al.

It is certified that error appears in the above-indentified patent and that said Letters Patent is hereby corrected as shown below:

TITLE PAGE:

[56] References Cited: Please add the following references:

U.S. PATENT DOCUMENTS 4,821,142  4/1989   Ushifusa et al. . . . . . . . . . . . . . . 361/395

FOREIGN PATENT DOCUMENTS 0 477 004  3/1992   European Patent Office

OTHER PUBLICATIONS

*Patent Abstracts of Japan*, vol. 12, No. 63 (E-585) 25 Feb. 1988 & JP-A-62 206861 (Hitachi) 11 Sept. 1987.

*Patent Abstracts of Japan*, vol. 12, No. 63 (C-490) 22 Apr. 1988 & JP-A-62 252340 (Matsushita Electric Works) 4 Nov. 1987.

*Patent Abstracts of Japan*, vol. 16, No. 66 (C-912) 19 Feb. 1992 & JP-A-03 261635 (Fujitsu) 21 Nov. 1991.

Signed and Sealed this

Twenty-fifth Day of June, 1996

Attest:

BRUCE LEHMAN

Attesting Officer    Commissioner of Patents and Trademarks